US005329135A

United States Patent [19]

Terakado

[11] Patent Number: 5,329,135

[45] Date of Patent: Jul. 12, 1994

[54] LIGHT EMITTING DEVICE FOR ACHIEVING HIGH LUMINOUS EFFICIENCY AND HIGH SATURATION LEVEL OF LIGHT OUTPUT

[75] Inventor: Tomoji Terakado, Tokyo, Japan

[73] Assignee: NEC Corporation, Japan

[21] Appl. No.: 140,816

[22] Filed: Oct. 21, 1993

Related U.S. Application Data

[63] Continuation of Ser. No. 907,689, Jul. 2, 1992, abandoned.

[30] Foreign Application Priority Data

Jul. 3, 1991 [JP] Japan .................................. 3-163061

[51] Int. Cl.5 ...................... H01L 29/00; H01L 33/00; H01L 31/12; H01S 3/18

[52] U.S. Cl. ........................................ 257/17; 257/13; 257/21; 257/23; 257/53; 257/79; 257/80; 257/82; 257/86; 372/43; 372/45

[58] Field of Search ........................ 257/13, 17, 21, 23, 257/53, 79, 80, 82, 86; 372/43, 45

[56] References Cited

U.S. PATENT DOCUMENTS

| | | | |
|---|---|---|---|
| 4,680,602 | 7/1987 | Watanabe et al. | 357/17 |
| 4,788,688 | 11/1988 | Hasenberg et al. | 372/45 |
| 4,992,837 | 2/1991 | Sakai et al. | 357/17 |

FOREIGN PATENT DOCUMENTS 485237 5/1992 European Pat. Off. .

OTHER PUBLICATIONS

Patent Abstracts of Japan, vol. 12, No. 285 (E-668), Oct. 14, 1988; and JP-A-63 128 785 (NEC Corp.), Jun. 1, 1988.

Applied Physics Letters, vol. 55, No. 18, Oct. 30, 1989, New York US, pp. 1877-1878, F. L. Schuermeyer et al., "Band-edge alignment in heterostructures".

IEEE Journal of Quantum Electronics, "Reliability of High Radiance in GaAsP/InP LED's Operating in the 1.2-1.3 μm Wavelength", vol. QE-17, No. 2, Feb. 1981.

Kabushikikaisha, Tosho, "Optical Communication Device Engineering—Light Emitting Device/Light Intercepting Device" (1984).

*Primary Examiner*—Sara W. Crane

*Assistant Examiner*—Valencia Martin Wallace

*Attorney, Agent, or Firm*—Ostrolenk, Faber, Gerb & Soffen

[57] ABSTRACT

A light emitting device has an indium gallium arsenide phosphide luminescent layer between a first clad layer of n-type indium phosphide and a second clad layer of p-type indium phosphide, and a strained barrier layer of p-type indium aluminum arsenide is inserted between the luminescent layer and the second clad layer so as to increase the potential barrier therebetween, thereby improving the luminous efficiency and the saturation point of the light output.

6 Claims, 1 Drawing Sheet

6a 7a 8 7 6 5 4 3 2 1 10 9 10

LIGHT EMITTING DEVICE FOR ACHIEVING HIGH LUMINOUS EFFICIENCY AND HIGH SATURATION LEVEL OF LIGHT OUTPUT

This is a continuation of application Ser. No. 07/907,689 filed on Jul. 2, 1992, now abandoned.

FIELD OF THE INVENTION

This invention relates to a semiconductor light emitting device and, more particularly, to a light emitting device fabricated from compound semiconductor films.

DESCRIPTION OF THE RELATED ART

A semiconductor light emitting devices is an indispensable component of an optical communication system, and has found a wide variety of application therein. In fact, the semiconductor light emitting device is used not only in the main network but also in subscriber's loops, a local area network and a data link network. User expects the optical communication system to be improved in performance, and research and development efforts have been made on a high-speed light emitting device.

One of the high-speed light emitting devices applicable as a light source in a low-loss fiber optics communication system has a double hetero-junction structure fabricated from $In_xGa_{1-x}As_yP_{1-y}$/ InP films, and is operative in wavelength of the order of I micron. However, a problem is encountered in the p-type InP/$In_xGa_{1-x}As_yP_{1-y}$/ InP double hetero-junction light emitting device operative in the 1 micron wavelength in that the luminous efficiency is lower than a GaA1As/ GaAs light emitting device operative in the 0.8 micron wavelength as described in "Optical Communication Device Engineering". The author of the book further teaches that the p-type InP/ $In_xGa_{1-x}As_yP_{1-y}$/InP double hetero-junction light emitting device is saturated while the light output is relatively low.

The reason for the low luminous efficiency as well as the low saturation output is recombination between holes and electrons injected into the luminescent layer through a leak process and/ or the Auger process without participation in production of light. The band offset ratio is defined as dEc/dEv where dec is the discontinuity between the conduction bands and dEv is the discontinuity between the valence bands. In the $In_xGa_{1-x}As_yP_{1-y}$ system, the band offset ratio is 0.22/0.38, and such a small band offset ratio allows electrons injected into the InGaAs luminescent layer to exceed the hetero-junction and flow into the p-type InP clad layer. Especially, the InGaAs luminescent layer can produce high-kinetic energy electrons through the Auger recombination process. However, such a narrow potential barrier hardly confines the high kinetic energy electrons in the luminescent layer, and allows the high kinetic energy electrons to flow into the p-type InP clad layer without producing light.

SUMMARY OF THE INVENTION

It is therefore an important object of the present invention provide a light emitting device which is large in luminous efficiency and is hardly saturated in the light output.

To accomplish the object, the present invention proposes to insert a strained barrier layer between a luminescent layer and a second clad layer for increasing potential barrier therebetween.

In accordance with the present invention, there is provided a light emitting device fabricated on a substrate formed of indium phosphide of a first conductivity type, comprising: a) a first clad layer formed on the substrate and of indium phosphide of the first conductivity type; b) a luminescent layer formed on the first clad layer, and having a luminescent film formed of compound semiconductor selected from the group consisting of indium gallium arsenic phosphide and indium gallium arsenide; c) a strained barrier layer formed on the luminescent layer and of indium aluminum arsenide of a second conductivity type expressed by the molecular formula of $In_{1-x}Al_xAs$ where x ranges between 0.48 and 1.00, the second conductivity type being opposite to the first conductivity type; and d) a second clad layer formed on the strained barrier layer and of indium phosphide of the second conductivity type.

BRIEF DESCRIPTION OF THE DRAWINGS

The feature and advantages of the light emitting device according to the present invention will be more clearly understood from the following description taken in conjunction with the accompanying drawings in which.

DESCRIPTION OF THE PREFERRED EMBODIMENT

Figure 1:
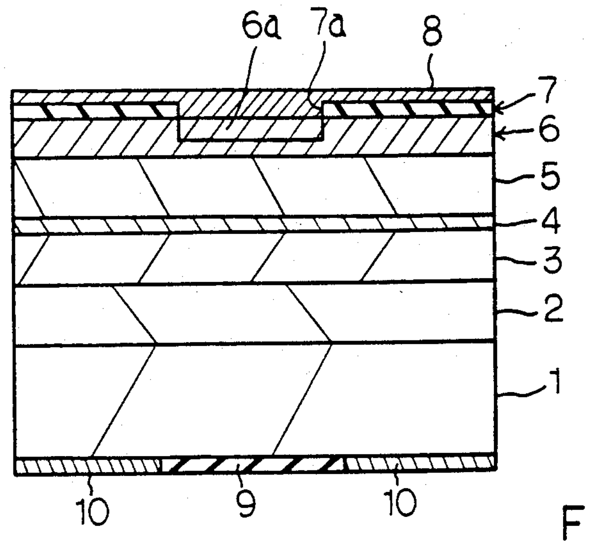
FIG. 1 is a cross sectional view showing the structure of a light emitting device according to the present invention.

Referring first to FIG. 1 of the drawings, a light emitting device embodying the present invention is fabricated on a substrate I of n-type indium phosphide. On the substrate I are epitaxially grown through a vapor phase exitaxy or a molecular beam epitaxy an n-type indium phosphide film 2, a p-type indium gallium arsenic phosphide film 3, a p-type indium aluminum arsenide film 4, a p-type indium phosphide film 5 and a p-type indium gallium arsenic phosphide film 6 which respectively serve as a first clad layer, a luminescent layer, a strained barrier layer, a second clad layer and a contact layer. In the following description, the first clad layer, the luminescent layer, the strained barrier layer, the second clad layer and the contact layer are also accompanied with the same references as the corresponding compound semiconductor films, respectively. The n-type indium phosphide film 2 is about 1 micron in thickness, and the carrier concentration thereof is about $2\times10^{17}$ $cm^{-3}$. The p-type indium gallium arsenic phosphide film 3 is lattice matched with the n-type indium phosphide film 2, and the energy band gap created therein allows the light emitting device to produce light of 1.3 micron wavelength. The p-type indium gallium arsenic phosphide film 3 is of the order of 0.5 micron, and the carrier concentration thereof is about $2\times10^{17}$ $cm^{-3}$. The p-type indium aluminum arsenide film 4 is as thin as about 0.02 micron, and the carrier concentration thereof is $5\times10^{17}$ $cm^{-3}$. The p-type indium aluminum arsenide film 4 is expressed by the molecular formula of $In_{1-x}Al_xAs$ where x is 0.54. However, x can range from 0.48 to 1.0.

Figure 2:
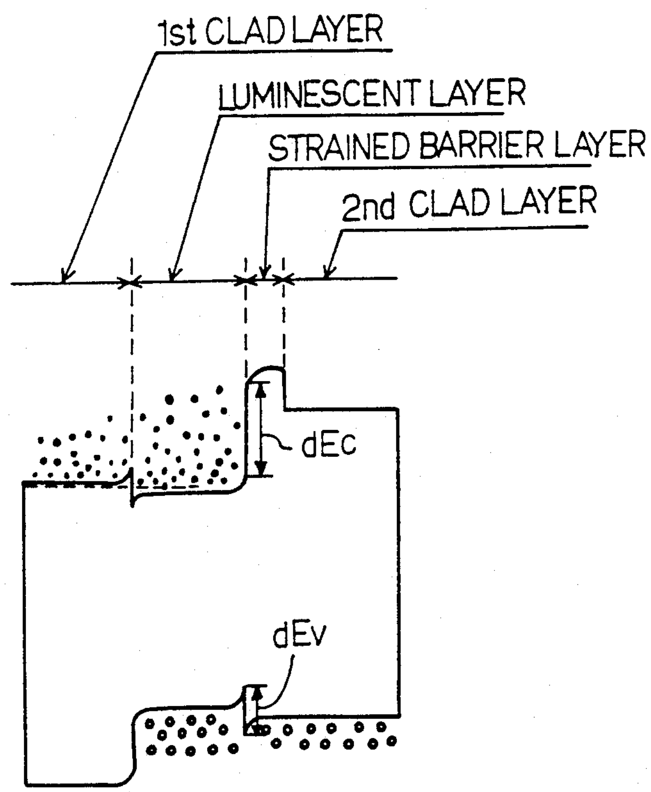
FIG. 2 is a diagram showing the energy bands created in the light emitting device.

If x is 0.48, a wide potential discontinuity takes place between the conduction bands as shown in FIG. 2, and the band offset ratio dEc/dEv is 0.50/0.22. In FIG. 2, dots in the conduction bands are indicative of electrons, and bubbles in the valence bands stand for holes. If x is increased from 0.48 to 1.00, the band offset ratio dEc/dEv is increased together with x, because the strain is enlarged. Thus, the strained barrier layer 4 increases the hetero-junction barrier between the conduction band of the luminescent layer 3 and the conduction band of the second clad layer 5, and electrons injected into the luminescent layer 3 hardly flow into the second clad layer 5 over the potential discontinuity dec. The wide potential discontinuity dec is especially effective against high kinetic energy electrons produced through the Auger process, and the high kinetic energy electrons confined in the luminescent layer 3 are effectively recombined with holes for producing light without flowing-out into the second clad layer 5. Thus, the electrons confined in the luminescent layer 3 are effectively recombined with the holes, and the luminous efficiency is improved. Moreover, the light output is not saturated over wide operation range.

Turning back to FIG. 1, the p-type indium phosphide film 5 is about 1 micron in thickness, and the carrier concentration thereof is about $5\times10^{17}$ $cm^{-3}$. The contact layer 6 is overlain by a dielectric film 7 which is patterned so as to form a window 7*a*. Cadmium or zinc is introduced through the window 7*a* into the contact layer 6, and heavily doped o-type contact region 6*a* is formed in the contact layer 6. A p-electrode 8 is held in contact with the heavily doped contact region 6*a*, and is formed of gold-zinc alloy. The back surface of the substrate 1 is grinded to about 100 microns, and an anti-reflecting film 9 and an n-electrode 10 are formed on the back surface of the substrate 1.

As will be appreciated from the foregoing description, the light emitting device according to the present invention confines electrons in the luminescent layer 3 by virtue of the wide potential discontinuity dec, and the high kinetic energy electrons thus confined in the luminescent layer 3 are effectively recombined with holes for producing light. This results in high luminescent efficiency as well as in high saturation output.

In the description on the embodiment, the light emitting device is exactly defined with the thicknesses of the compound semiconductor films and the carrier concentrations thereof. However, these dimensions and the concentrations merely illustrate the present invention by example, and never set limit to the present invention. Similarly, there is no limitation to the substances of the electrodes 8 and 10 as well as the substance of the dielectric films 7 and 9.

Although particular embodiments of the present invention have been shown and described, it will be obvious to those skilled in the art that various changes and modifications may be made without departing from the spirit and scope of the present invention. For example, a luminescent layer may be formed in a quantum well structure.

What is claimed is:

1. A light emitting device, comprising:

a) a substrate formed of indium phosphide of a first conductivity type;

b) a first clad layer formed on said substrate and of indium phosphide of said first conductivity type;

c) a luminescent layer formed on said first clad layer, and having a luminescent film of indium gallium arsenic phosphide compound semiconductor;

d) a strained barrier layer formed on said luminescent layer and of indium aluminum arsenide of a second conductivity type expressed by the molecular formula of $In_{1-x}Al_xAs$ where x ranges between 0.48 and 1.00, said second conductivity type being opposite to said first conductivity type, said strained barrier layer being formed separately from said luminescent layer; and e) a second clad layer formed on said strained barrier layer and of indium phosphide of said second conductivity type.

2. A light emitting device as set forth in claim 1, in which n-type impurity atoms are introduced in said substrate and said first clad layer, and p-type impurity atoms are introduced in said luminescent film, said strained barrier layer and said second clad layer.

3. A light emitting device as set forth in claim 1, in which said light emitting device further comprises:

e) a contact layer formed on said second clad layer, said contact layer being formed of indium gallium arsenic phosphide of said second conductivity type, f) a dielectric film formed on said contact layer, and allowing said contact layer to have a heavily doped contact region, g) a first electrode formed on said dielectric film, and held in contact with said heavily doped contact region, h) an anti-reflecting film covering a part of a back surface of said substrate on the opposite side to said first clad layer, and i) a second electrode covering another part of said back surface of said substrate.

4. A light emitting device comprising:

a) a substrate formed of indium phosphide of a first conductivity type;

b) a first clad layer formed on said substrate and of indium phosphide of said first conductivity type;

c) a luminescent layer formed on said first clad layer, and having a luminescent film of indium gallium arsenide compound semiconductor;

d) a strained barrier layer formed on said luminescent layer and of indium aluminum arsenide of a second conductivity type expressed by the molecular formula of $In_{1-x}Al_xAs$ where x ranges between 0.48 and 1.00, said second conductivity type being opposite to said first conductivity type, said strained barrier layer being formed separately from said luminescent layer; and e) a second clad layer formed on said strained barrier layer and of indium phosphide of said second conductivity type.

5. A light emitting device as set forth in claim 4, in which n-type impurity atoms are introduced in said substrate and said first clad layer, and p-type impurity atoms are introduced in said luminescent film, said strained barrier layer and said second clad layer.

6. A light emitting device as set forth in claim 4, in which said light emitting device further comprises:

e) a contact layer formed on said second clad layer, said contact layer being formed of indium gallium arsenic phosphide of said second conductivity type, f) a dielectric film formed on said contact layer, and allowing said contact layer to have a heavily doped contact region, g) a first electrode formed on said dielectric film, and held in contact with said heavily doped contact region, h) an anti-reflecting film covering a part of a back surface of said substrate on the opposite side to said first clad layer, and i) a second electrode covering another part of said back surface of said substrate.

* * * * *